(12) United States Patent
Basker et al.

(10) Patent No.: US 8,946,063 B2
(45) Date of Patent: Feb. 3, 2015

(54) SEMICONDUCTOR DEVICE HAVING SSOI SUBSTRATE WITH RELAXED TENSILE STRESS

(71) Applicant: International Business Machines Corporation, Armonk, NY (US)

(72) Inventors: Veeraraghavan S. Basker, Schenectady, NY (US); Ali Khakifirooz, Mountain View, CA (US); Pranita Kerber, Singerlands, NY (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 13/690,240

(22) Filed: Nov. 30, 2012

(65) Prior Publication Data

US 2014/0151802 A1    Jun. 5, 2014

(51) Int. Cl.
*H01L 21/20* (2006.01)
*H01L 29/78* (2006.01)

(52) U.S. Cl.
CPC .................................. *H01L 29/785* (2013.01)
USPC ........... 438/479; 438/149; 438/151; 438/267; 257/347

(58) Field of Classification Search
CPC ....................................................... H01L 29/78
USPC .................... 257/347; 438/149, 151, 199, 269
See application file for complete search history.

(56) References Cited

U.S. PATENT DOCUMENTS

| | | | |
|---|---|---|---|
| 7,224,033 B2 | 5/2007 | Zhu et al. | 257/401 |
| 7,544,585 B2* | 6/2009 | Park et al. | 438/458 |
| 7,575,975 B2* | 8/2009 | Thean et al. | 438/275 |
| 7,615,806 B2* | 11/2009 | Thean et al. | 257/206 |
| 7,619,239 B2* | 11/2009 | Irisawa et al. | 257/19 |
| 7,709,893 B2 | 5/2010 | Bauer et al. | 257/350 |
| 7,842,559 B2 | 11/2010 | Jakschik et al. | 438/150 |
| 7,993,999 B2 | 8/2011 | Basker et al. | 438/199 |
| 8,183,627 B2* | 5/2012 | Currie | 257/329 |
| 8,445,963 B2* | 5/2013 | Jakschik et al. | 257/347 |
| 8,519,436 B2* | 8/2013 | Lochtefeld et al. | 257/190 |
| 8,709,884 B2* | 4/2014 | Currie | 438/164 |
| 2005/0224800 A1* | 10/2005 | Lindert et al. | 257/66 |
| 2005/0250285 A1* | 11/2005 | Yoon et al. | 438/283 |
| 2006/0197126 A1* | 9/2006 | Lochtefeld et al. | 257/288 |
| 2007/0001231 A1* | 1/2007 | Currie | 257/368 |
| 2007/0045738 A1* | 3/2007 | Jones et al. | 257/347 |
| 2007/0065990 A1* | 3/2007 | Degroote et al. | 438/142 |
| 2007/0298549 A1* | 12/2007 | Jurczak et al. | 438/149 |
| 2008/0265280 A1* | 10/2008 | Currie | 257/190 |
| 2009/0261412 A1* | 10/2009 | Saito et al. | 257/347 |

(Continued)

OTHER PUBLICATIONS

Maitra, et al, "Aggressively Scaled Strained-Silicon-on-Insulator Undoped-Body-High-K/Metal-Gate nFinFETs for High-Performance Logic Applications", IEEE Electron Device Letters, vol. 32, No. 6, Jun. 2011, (pp. 713-715).

(Continued)

*Primary Examiner* — Caleb Henry
(74) *Attorney, Agent, or Firm* — Harrington & Smith

(57) ABSTRACT

A method comprises: forming a tensile SSOI layer on a buried oxide layer on a bulk substrate; forming a plurality of fins in the SSOI layer; removing a portion of the fins; annealing remaining portions of the fins to relax a tensile strain of the fins; and merging the remaining portions of the fins.

16 Claims, 8 Drawing Sheets

(56) References Cited

U.S. PATENT DOCUMENTS

| | | | |
|---|---|---|---|
| 2011/0068375 A1* | 3/2011 | Jakschik et al. | 257/255 |
| 2011/0147805 A1* | 6/2011 | Irisawa et al. | 257/255 |
| 2011/0175166 A1* | 7/2011 | Bedell et al. | 257/351 |
| 2011/0266622 A1 | 11/2011 | Luning et al. | 257/347 |
| 2012/0146053 A1* | 6/2012 | Saitoh et al. | 257/77 |
| 2012/0220083 A1* | 8/2012 | Currie | 438/151 |
| 2012/0235234 A1* | 9/2012 | Chang et al. | 257/347 |
| 2012/0313169 A1* | 12/2012 | Wahl et al. | 257/347 |
| 2013/0082329 A1* | 4/2013 | Chen et al. | 257/347 |
| 2013/0175618 A1* | 7/2013 | Cheng et al. | 257/347 |
| 2013/0256799 A1* | 10/2013 | Wu et al. | 257/347 |
| 2013/0270641 A1* | 10/2013 | Chi | 257/351 |
| 2013/0334602 A1* | 12/2013 | Guo et al. | 257/347 |
| 2014/0077296 A1* | 3/2014 | Yamashita et al. | 257/347 |
| 2014/0110785 A1* | 4/2014 | Jagannathan et al. | 257/347 |
| 2014/0117447 A1* | 5/2014 | Basker et al. | 257/347 |
| 2014/0138771 A1* | 5/2014 | Brink et al. | 257/347 |

OTHER PUBLICATIONS

Put, et al., "Geometry and Strain Dependence of the Proton Radiation Behavior of MuGFET Devices", IEEE Transactions on Nuclear Science, vol. 54, No. 6, Dec. 2007, (pp. 2227-2232).

Irisawa, et al, "Electron Mobility and Short-Channel Device Characteristics of SOI FinFETs With Uniaxially Strained (110) Channels", IEEE Transactions on Electron Devices, vol. 56, No. 8, Aug. 2009, (pp. 1651-1658).

Thijs, et al,, "Characterization and Optimization of Sub-32-nm FinFET Devices for ESD Applications", IEEE Transactions on Electron Devices, vol. 55, No. 12, Dec. 2008, (pp. 3507-3516).

* cited by examiner

SEMICONDUCTOR DEVICE HAVING SSOI SUBSTRATE WITH RELAXED TENSILE STRESS

BACKGROUND

The exemplary embodiments of this invention relate generally to semiconductor devices and, more specifically, to a complementary metal oxide semiconductor device having a strained silicon-on-insulator substrate.

A complementary metal oxide semiconductor device (CMOS) uses complementary and symmetrically-oriented pairs of p-type and n-type metal oxide semiconductor field effect transistors (MOSFETs) arranged on silicon or silicon-on-insulator (SOI) substrates. A MOSFET, which is used for amplifying or switching electronic signals for logic functions, has source and drain regions connected by a channel. The source region is a terminal through which current in the form of majority charge carriers (i.e. electrons or holes) enters the channel, and the drain region is a terminal through which current in the form of majority charge carriers leaves the channel. In a p-type MOSFET (hereinafter "PFET"), the majority charge carriers are holes that flow through the channel, and in an n-type MOSFET (hereinafter "NFET"), the majority charge carriers are electrons that flow through the channel. A gate overlies the channel and controls the flow of current between the source and drain regions. The channel may be defined by a thin "fin" that provides more than one surface through which the gate controls the flow of current, thereby making the PFETs and NFETs "finFET" devices. Generally, the length of the fin is several orders of magnitude greater than the width.

Substrates used in the fabrication of PFETs and NFETs may comprise strained silicon-on-insulator (SSOI) substrates. Such substrates generally have intrinsic tensile stresses of several giga-Pascals (GPa), which generally improves electron mobility, thereby improving device performance. The strain in these substrates allows for improvement in device performance without a degradation in electrostatic characteristics even in short-channel finFET devices where the length and the width of the channel is short compared to those of typical planar MOSFETs.

When the global intrinsic stresses in an SSOI substrate exceed a predetermined maximum value (e.g., greater than about 1 GPa), however, the performance of PFET finFET devices may be compromised by 8 to 15%. This is a consequence of hole mobility degradation in the presence of tensile stress in the SSOI substrates. Accordingly, it is desirable to relax the tensile stress in the channels of PFET devices and to improve/restore their performance to the SOI substrate levels. If this can be achieved, NFET devices can be produced having higher performance without degrading the complementary PFET devices.

BRIEF SUMMARY

In one exemplary aspect, a method comprises: forming a tensile SSOI layer on a buried oxide layer on a bulk substrate; forming a plurality of fins in the SSOI layer; removing a portion of the fins; annealing a remaining portion of the fins to relax a tensile strain of the fins; and merging the remaining portions of the fins.

In another exemplary aspect, a method comprises: attaching a tensile SSOI layer to a first surface of a substrate; forming a plurality of fins in the SSOI layer; forming a gate across and transverse to the plurality of fins; removing at least a portion of the fins using an etching technique; subjecting a remaining portion of the fins to an elevated temperature to relax a tensile strain of the fins; merging remaining portions of the fins on a source side of the gate using an epitaxial growth of at least one of Si and SiGe on the fins to form a merged source region; and merging remaining portions of the fins on a drain side of the gate using an epitaxial growth of at least one of Si and SiGe on the fins to form a merged drain region.

In another exemplary aspect, an apparatus comprises: a substrate having a tensile SSOI layer; a plurality of fins formed on the SSOI layer and extending perpendicular from the substrate and parallel to each other, the fins having a tensile strain; a gate positioned across and extending transverse to the fins, the fins on a first side of the gate being in communication with sources and the fins on a second side of the gate being in communication with drains; a source region merging the fins on the first side of the gate; and a drain region merging the fins on the second side of the gate. The source region and the drain region comprise a layer formed by epitaxial growth of at least one of Si and SiGe.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

In exemplary embodiments of the present invention, a semiconductor device is fabricated using a strained silicon-on-insulator (SSOI) layer in which intrinsic tensile stresses are relaxed. Relaxation of the tensile stresses enhances performance of the PFET semiconductor device. Although the semiconductor device is hereinafter referred to as being a PFET, the semiconductor device is not so limited and may comprise an NFET.

In the fabrication of the PFET, fins are formed from a strained silicon-on-insulator (SSOI) substrate, and gate stack layers and spacers are formed on the fins. Portions of the fins are removed, and the uniaxial tensile strain of the remaining material of the fins is relaxed by subjecting the fins to an elevated temperature ("pre-bake") for a period of time. Silicon or silicon germanium (SiGe) is epitaxially grown on exposed faces of the fins to merge the source and drain regions. A thin metal layer is deposited on the epitaxially grown silicon or SiGe, and a low temperature annealing process is carried out to form silicide on the silicon or SiGe. The exemplary embodiments disclosed herein are applicable to either single fins or arrangement of multiple fins.

Figure 1A:
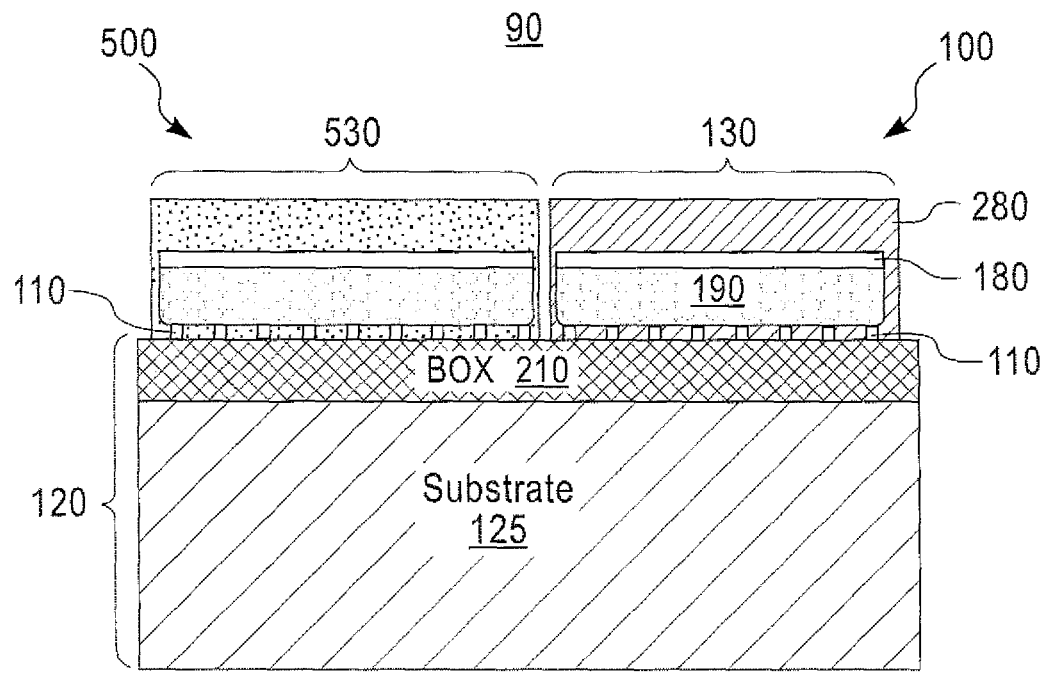
FIG. 1A is a cross-sectional view parallel to the gate (perpendicular to the fins) of one exemplary embodiment of a PFET and an NFET on a substrate, the fins of the PFET and the NFET being merged to form merged source regions and merged drain regions.
Figure 1B:
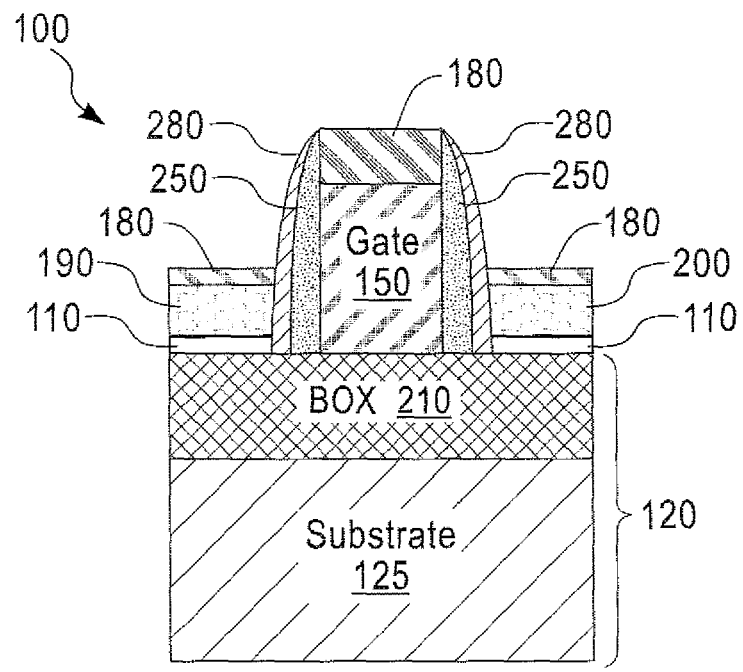
FIG. 1B is a cross-sectional view of FIG. 1A perpendicular to the gate (parallel to the fins) and showing a PFET substrate region.

As shown in FIG. 1A, one exemplary embodiment of a CMOS device is designated generally by the reference number 90 and is hereinafter referred to as "device 90." Device 90 may comprise a PFET 100 and an NFET 500 formed on a substrate 120. The PFET 100 may comprise a plurality of fins 110 oriented parallel to each other and merged together to define a source region 190 on one side of a gate region 130 and a plurality of fins 110 oriented parallel to each other and merged together to define a drain region 200 (FIG. 1B) on an opposing side of the gate region 130. The gate region 130 extends transverse to the fins 110 and comprises a single or multi-layer gate 150 and first spacers 250 and second spacers 280 on opposing sides of the gate 150. In embodiments employing a multi-layer gate 150, the gate 150 may include a high k dielectric material disposed on the substrate 120 and over each fin 110. Silicide caps 180 are deposited on top portions of the gate 150 and on top portions of the fins 110, as described below. As shown, the gate 150 may be defined using a gate-first integration scheme. However, it should be understood that the exemplary embodiments as described with regard to the gate 150 are also applicable to replacement metal gate (RMG) techniques.

Figure 2:
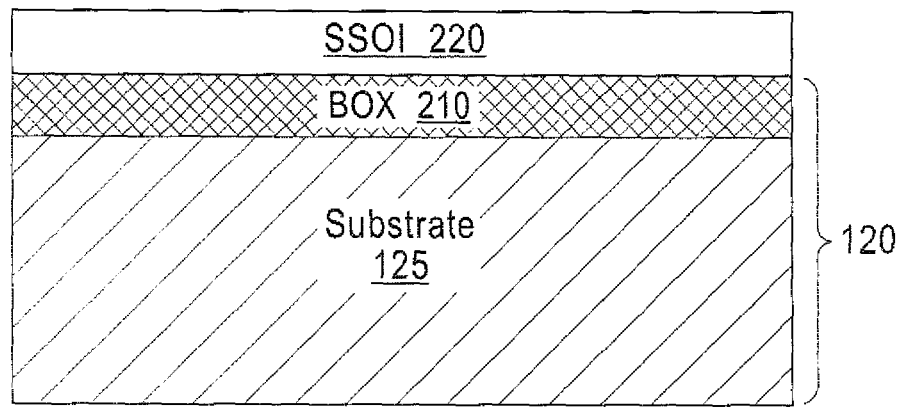
FIG. 2 is a cross-sectional view of the substrate of FIGS. 1A and 1B.

Referring now to FIGS. 2-8B, one exemplary method of fabricating the PFET 100 is shown. As shown in FIG. 2, the substrate 120 may comprise a bulk silicon material 125 having a buried oxide layer 210 of silicon dioxide ($SiO_2$) thereon. An SSOI layer 220 from which the fins 110 are formed is attached to the buried oxide layer 210. The SSOI layer 220 is generally attached to the buried oxide layer 210 using a layer transfer technique employing a thermal activation process in which a donor substrate wafer is sliced horizontally and a thin layer from the donor substrate wafer is placed onto and bonded to a new substrate (in this case the buried oxide layer 210). One exemplary layer transfer technique that may be used is SMART CUT, which is available from S.O.I.TEC, S.A., of Grenoble, France. The exemplary embodiments as described herein are not limited to the attachment of the SSOI layer 220 by a layer transfer technique, however, as other methods of forming the SSOI layer are feasible.

Figure 3A:
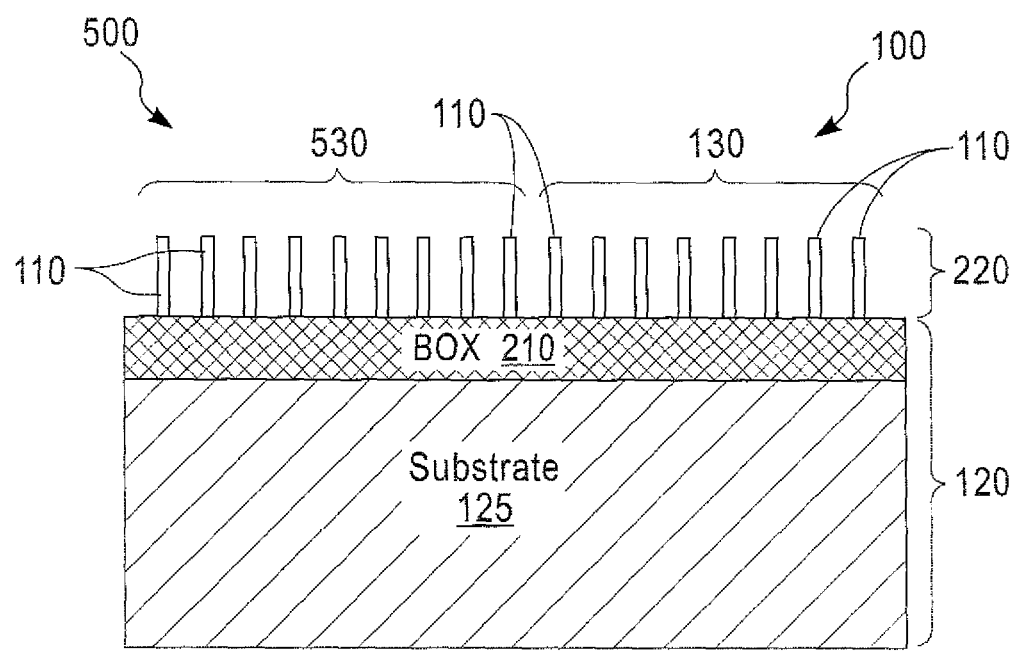
FIG. 3A is a cross-sectional view of the substrate of FIG. 2 having fins formed thereon, the view being perpendicular to the fins.
Figure 3B:
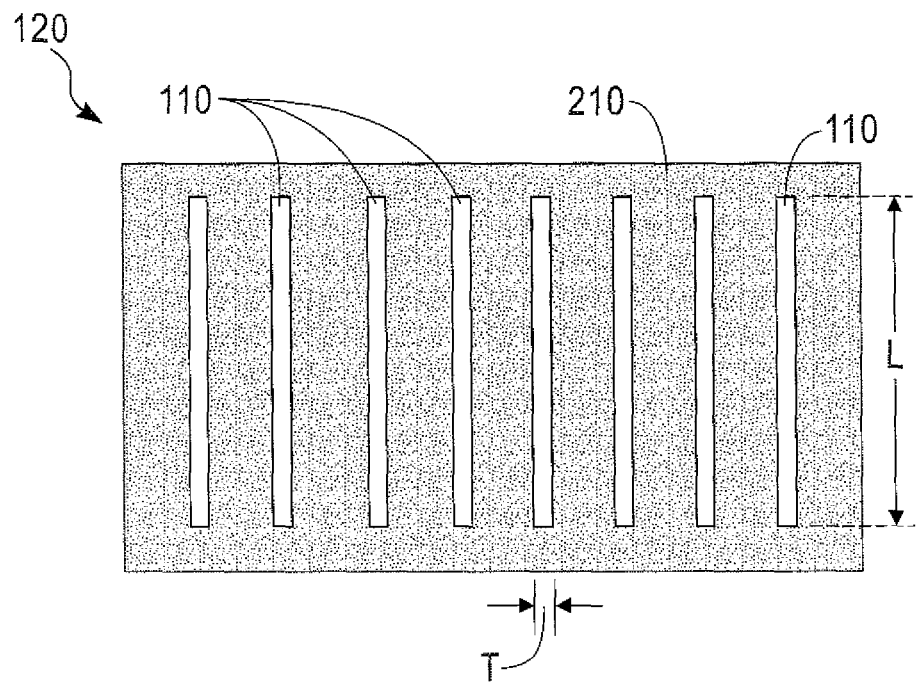
FIG. 3B is a top view of the substrate of FIG. 3A.

Referring now to FIGS. 3A and 3B, the fins 110 are formed in the SSOI layer 220 by using lithography and etching the SSOI layer 220 down to the buried oxide layer 210. As shown, the fins 110 define in part the PFET 100 as well as an adjacent NFET 500. Once formed, as shown in FIG. 3B, a thickness T of an exemplary fin 110 is about 7 nm to about 20 nm, and a height h is about 20 nm to about 30 nm. The length of the fins could range from about 100 nm to a few microns. However, the gate-pitch could be 60 nm to 500 nm. The SSOI layer 220 may be etched using a dry etch technique (e.g., plasma dry etching such as reactive ion etching (RIE) or the like or a non-plasma etching technique using, for example, fluorine-containing gas).

Figure 4A:
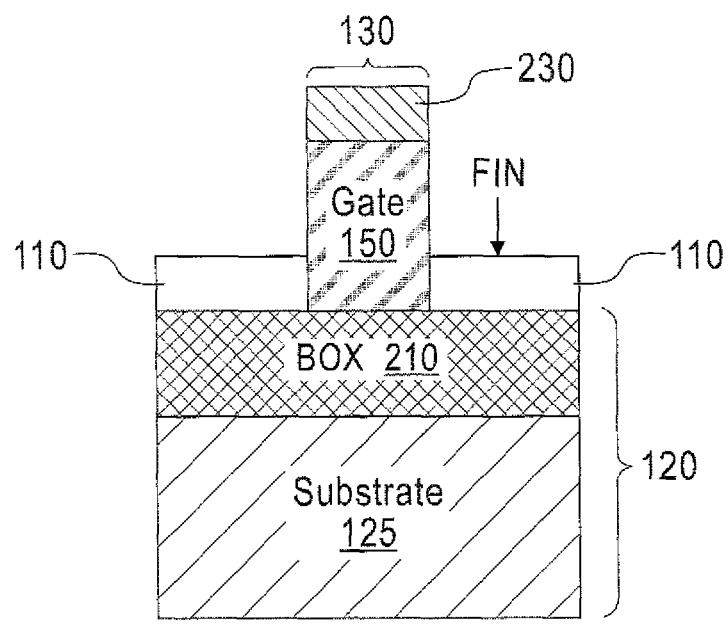
FIG. 4A is a cross-sectional view of the PFET substrate region parallel to the fins and showing a gate region formed across the fins.

Referring to FIGS. 4A-6B, the gate regions on each of the PFET 100 and NFET 500 are defined by one or more layers stacked transverse to the fins 110. In forming the gate region 130 of the PFET 100 and the gate region 530 of the NFET as shown in FIGS. 4A and 4B, polysilicon or metal layer(s) (along with any desired dielectric layers, not shown) are deposited between and over the fins 110 and then patterned using lithography and etch steps to define gate stack layers (e.g., gate 150 and gate 550 of the NFET 500) that extend transverse to the fins 110.

In any exemplary embodiment, the gate stack layers are patterned accordingly. To inhibit the epitaxial growth of the Si or SiGe on the gate 150 (or gate 550) while allowing the epitaxial growth on the fins 110, a nitride cap 230 of hardmask material is deposited using low pressure chemical vapor deposition (LPCVD) on top of the gate layers and patterned during gate 150 (and gate 550) definition. Hardmask materials from which the nitride caps 230 may be formed may be any nitride-based dielectric material including, but not limited to, SiN, $Si_3N_4$, silicon carbon nitride, combinations of the foregoing materials, and the like.

Figure 5A:
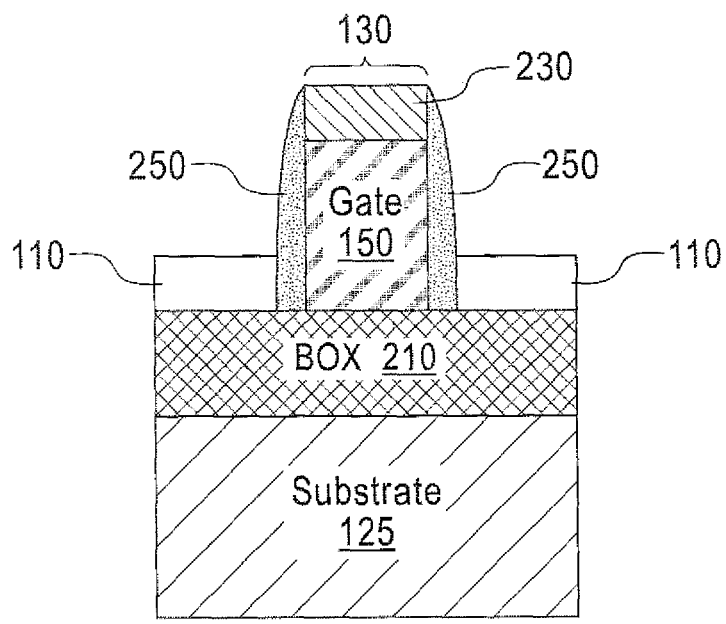
FIG. 5A is a cross-sectional view of the PFET substrate region perpendicular to the gate with first spacers and optional implant extensions.

As shown in FIG. 5A, first spacers 250 are formed on opposing sides of the gate 150 of the PFET 100. The first spacers 250 are formed by the deposition of a hardmask material on sides of the gate stack layers and the nitride cap 230 and removing portions of the hardmask material using a dry etch process (e.g., reactive ion etching (RIE)) to form the shape of the first spacers 250. Hardmask materials from which the first spacers are formed may be any dielectric material including, but not limited to, SiN, $Si_3N_4$, $SiO_2$, silicon carbon nitride, and the like.

Figure 5B:
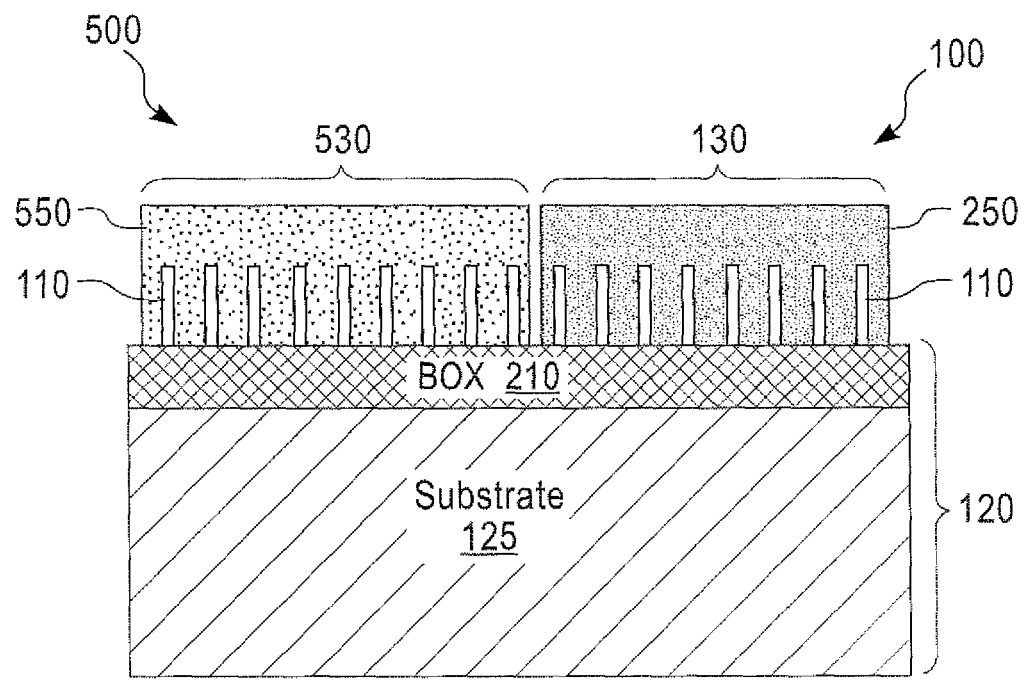
FIG. 5B is a cross-sectional view perpendicular to the fins of the PFET substrate region and the NFET substrate region and parallel to the gate region and first spacers.

Once the first spacers 250 are formed, dopant ions may be implanted under the first spacers 250 to form source and drain extension regions. The dopant ions may be implanted to form the extension regions using any suitable ion implantation technique. Ions that may be implanted in PFET 100 to form the extension regions include, but are not limited to, boron, boron difluoride ($BF_2$), and the like. As shown in FIG. 5B, first spacers 550 (similar to first spacers 250) may be formed on opposing sides of the gate region 530 of the NFET 500.

Figure 6A:
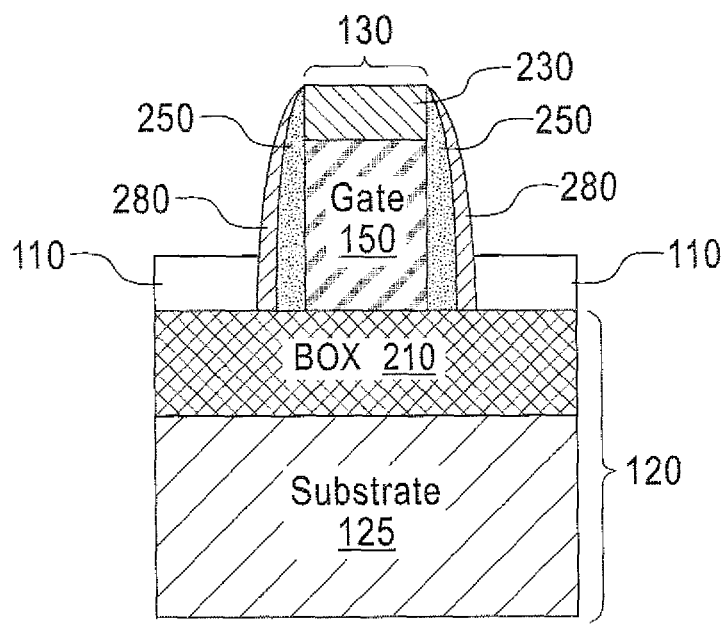
FIG. 6A is a cross-sectional view of the PFET substrate region parallel to the fins, showing first and second spacers disposed on either side of the gate.

As shown in FIG. 6A, second spacers 280 may then be formed on the first spacers 250 of the PFET 100 by the deposition of a hardmask material on sides of the first spacers 250 and etching of the hardmask material using RIE. As with the first spacers 250, hardmask materials from which the second spacers 280 are formed may be any dielectric material including, but not limited to, SiN, $Si_3N_4$, $SiO_2$, silicon carbon nitride, and the like.

Figure 6B:
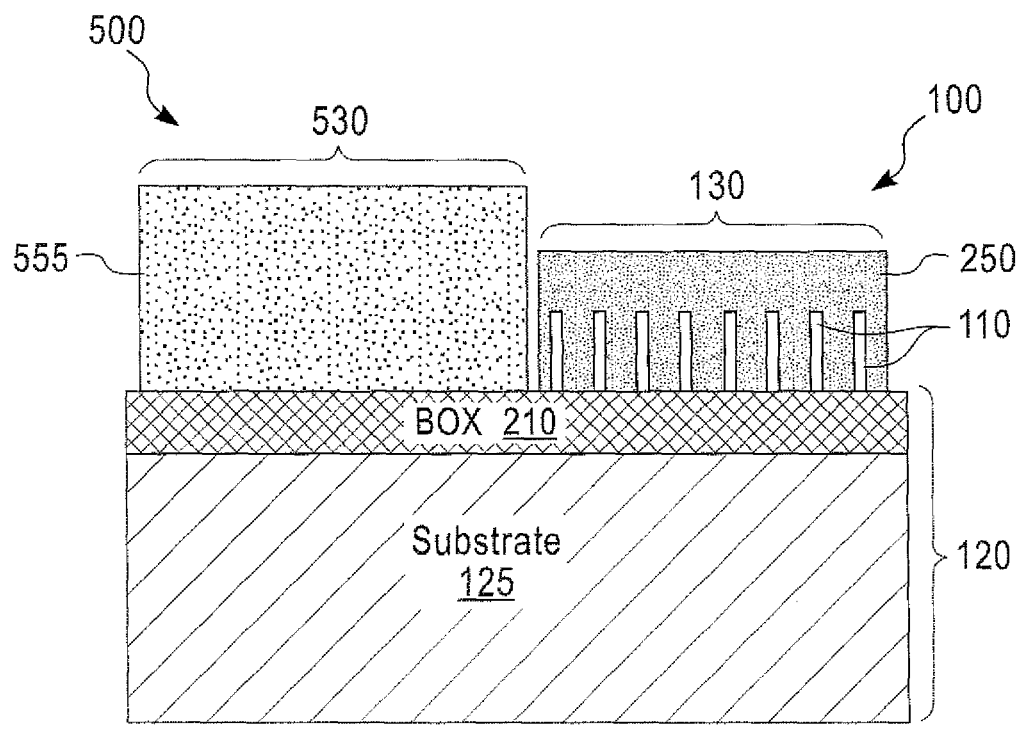
FIG. 6B is a cross-sectional view of the PFET substrate region and the NFET substrate region parallel to the gate and spacer with the NFET substrate region masked off.

Second spacers may also be formed on the first spacers 550 of the NFET 500. In embodiments in which second spacers 280 are formed on the first spacers 250 of the PFET 100 and not on the first spacers 550 of the NFET 500, however, a mask 555 may be deposited on the first spacers 550 of the NFET 500 as shown in FIG. 6B, thereby allowing the second spacers 280 to be deposited only on the first spacers 250 of the PFET 100 and not on the first spacers 550 of the NFET 500.

Figure 7A:
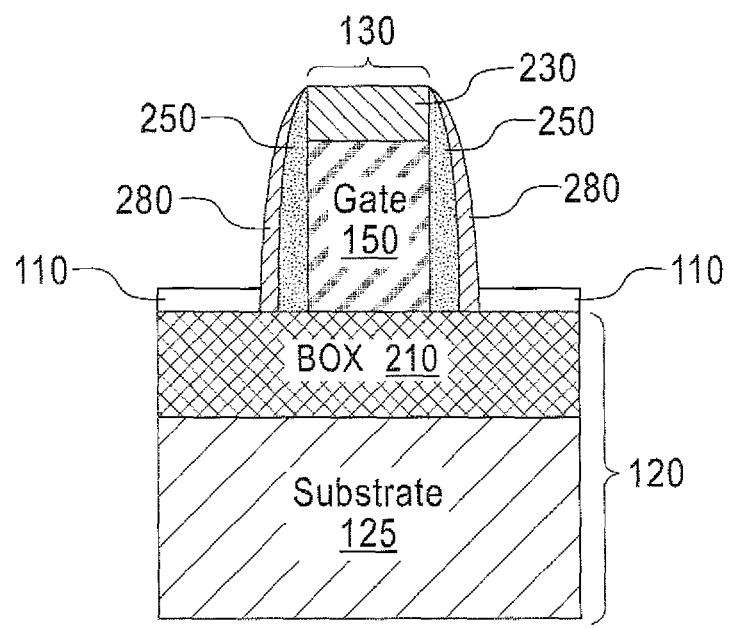
FIG. 7A is a cross-sectional view of the PFET substrate region perpendicular to the gate, showing the fins etched back.
Figure 7B:
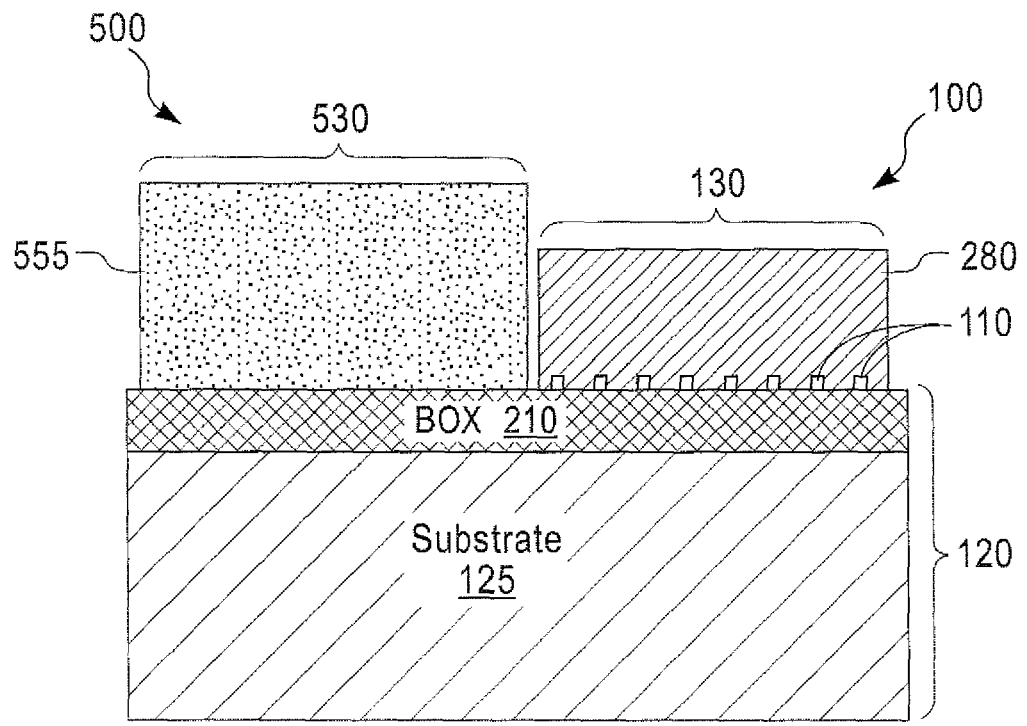
FIG. 7B is a cross-sectional view perpendicular to the fins showing the fins of the PFET substrate region etched back and the NFET substrate region masked off.

As shown in FIGS. 7A and 7B, the fins 110 of the PFET 100 are etched back to a height of about 2 nm to about 5 nm in preparation for merging the fins 110 using Si or SiGe epitaxy. The fins 110 are etched back using any suitable isotropic etching technique (e.g., plasma dry etching such as RIE or the like). The mask 555 remains on the NFET 500 as shown in FIG. 7B.

After the fin etch back process, the substrate 120, the remaining portions of the fins 110, and the gate stack are subjected to an in-situ pre-epitaxy anneal referred to as epitaxy pre-bake. This step is employed to obtain oxide-free silicon/semiconductor surfaces for epitaxial growth. Contamination at the SSOI/epitaxy interface can lead to high density of epitaxy defects, which may result in higher device leakage currents, which may in turn compromise the yield of the PFET 100. The epitaxy pre-bake is carried out in a hydrogen atmosphere at temperatures between about 700 and 900 degrees C. for about 2 to about 30 minutes. Preferably, the pre-bake is carried out at about 800 degrees C. for about 2 minutes. During the pre-bake step the portions of the fins 110 in the source, drain, and channel regions under the gate are relaxed to about 10% of the stress levels prior to gate definition, which is sufficient to not cause degradation in the hole mobility and performance of the PFET 100.

Figure 8A:
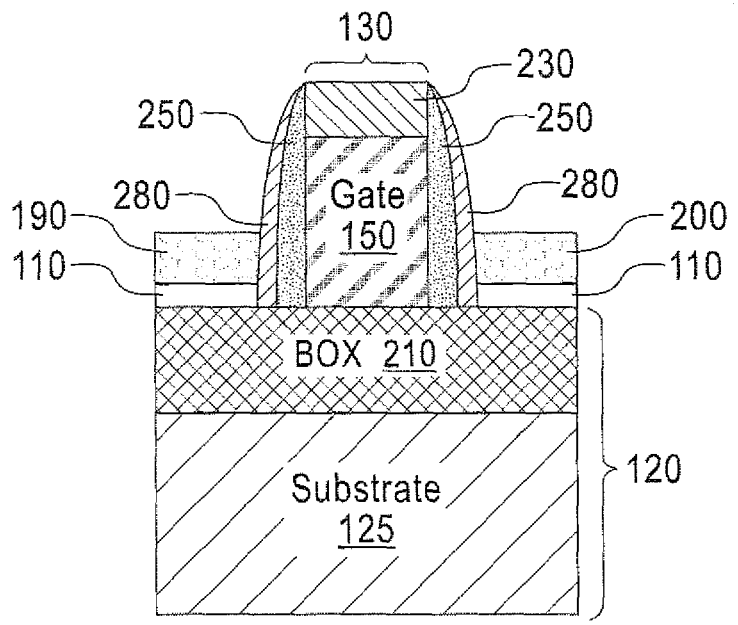
FIG. 8A is a cross-sectional view perpendicular to the gate showing a merged source region and a merged drain region on the PFET substrate region.
Figure 8B:
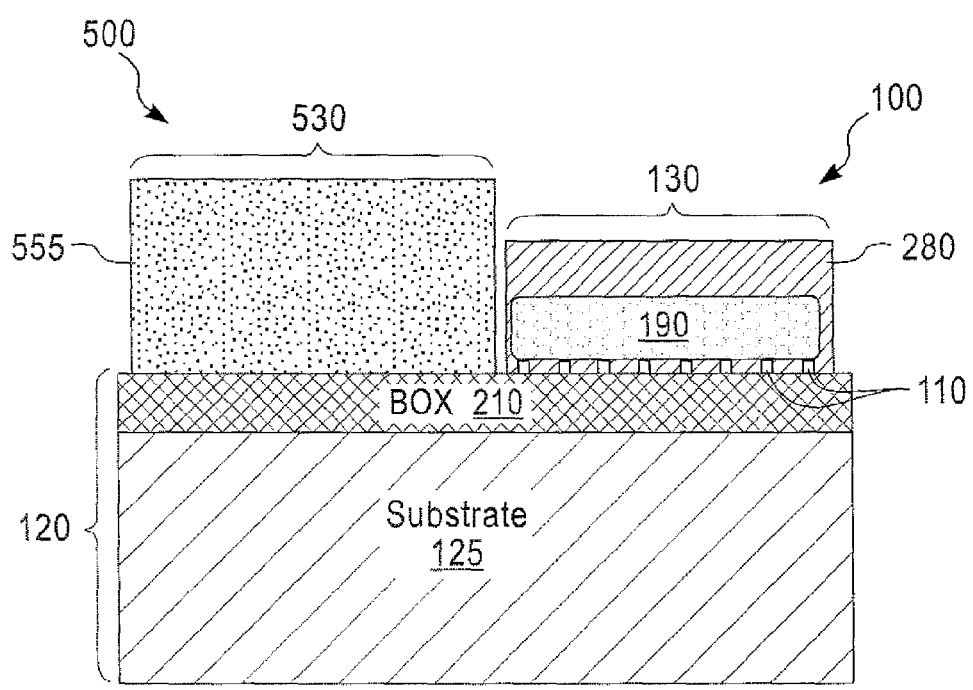
FIG. 8B is a cross-sectional view perpendicular to the fins showing the merged source region and the merged drain region on the PFET substrate region and showing the NFET substrate region masked off.

As shown in FIGS. 8A and 8B, an epitaxial growth process is used to grow Si or SiGe on exposed 110 and 100 crystal faces of the remaining portions of the fins 110. The epitaxial growth of Si or SiGe on these faces merges the fins 110 of the PFET 100 on one side of the gate region 130 into the source regions 190. The fins 110 of the PFET 100 on the other side of the gate region 130 are also merged into the drain regions 200. A growth temperature of the Si or SiGe on the fins 110 is between about 500 to about 850 degrees C. (preferably about 800 degrees C.) for about 20 to 40 minutes to further relax the tensile strain. The merged fins of both the source regions 190 and the drain regions 200 (shown in FIGS. 8A and 8B) formed by the epitaxial growth of the Si or SiGe in conjunction with the relaxed tensile strain of the fins 110 inhibits the degradation of performance in a finished PFET 100.

The source regions 190 and the drain regions 200 may be doped with acceptor dopants. Doping may be either by in-situ epitaxy or implantation of ions such as phosphorous or boron. Optionally, a source/drain ion implant process may be carried out on the PFET 100.

Figure 4B:
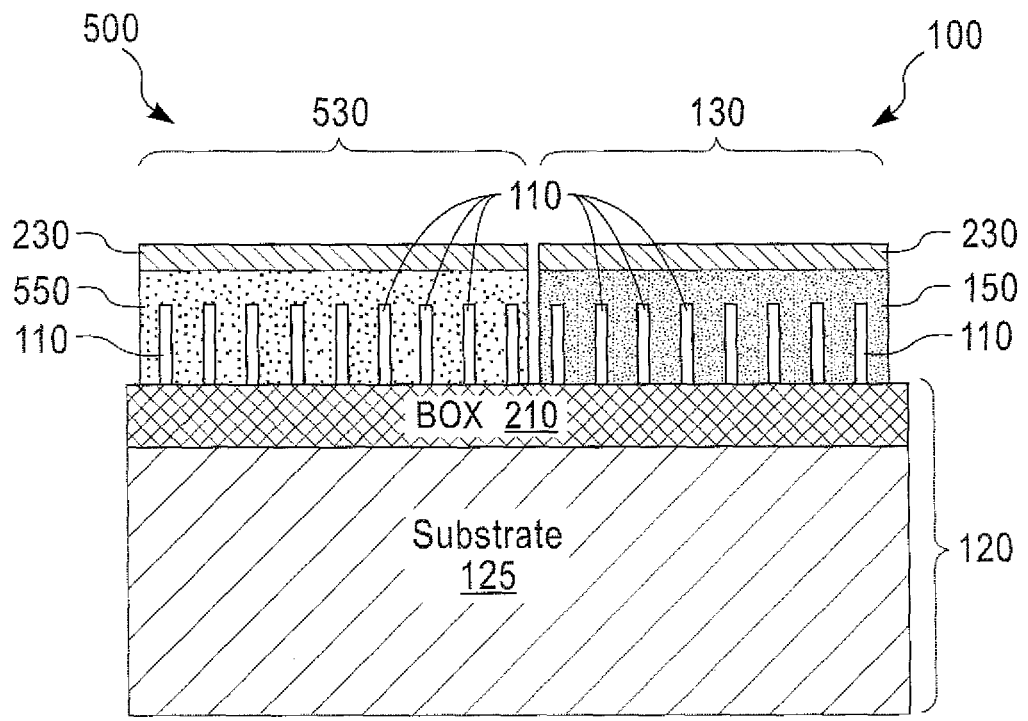
FIG. 4B is a cross-sectional view of the PFET substrate region and an NFET substrate region parallel to the gate region of FIG. 4A.

Referring back to FIGS. 1A and 1B, the mask 555 on the NFET 500 may be removed, and the nitride cap 230 on the gate 150 (and gate 550, as shown in FIG. 4B) may be removed by a wet etching technique employing one or more of hydrofluoric acid (HF) and phosphoric acid ($H_3PO_4$). Once the nitride caps 230 are removed, the silicide caps 180 may be formed on the gate 150 and gate 550 between the first spacers 250 on either side of the gate 150 and gate 550 and on top surfaces of the merged fins of the source regions 190 and the drain regions 200. In forming the silicide caps 180, a thin layer (5-15 nm) of a suitable metal is deposited on the gate 150 and the merged fins. The silicide cap 180 may then be formed by annealing at low temperature. Exemplary metals from which the silicide may be formed include, but are not limited to, platinum, titanium, cobalt, nickel, tantalum, tungsten, and molybdenum.

Optionally, the PFET 100 can be masked off, and the fins 110 in the source/drain regions of the NFET 500 can also be merged by epitaxy as described above. Doping of the epitaxy of the NFET 500 can also be carried out in-situ. Furthermore, ion implantation may be carried out in the doped source/drain regions of the NFET 500 (while the PFET 100 is masked off). Additionally, a thermal annealing step may be applied to the PFET 100 and the NFET 100 to diffuse and activate any dopants applied.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A method for fabricating a semiconductor device, comprising:
   forming a tensile SSOI layer on a buried oxide layer, the buried oxide layer being on a bulk substrate;
   forming a plurality of fins in the SSOI layer;
   removing a portion of the fins;
   annealing a remaining portion of the fins to relax a tensile strain of the fins; and
   merging the remaining portions of the fins;
   wherein merging the remaining portions of the fins comprises epitaxially growing at least one of Si and SiGe on the fins; and
   wherein epitaxially growing at least one of Si and SiGe on the fins comprises depositing at least one of Si and SiGe on the fins and heating the fins to a temperature of about 500 degrees to about 850 degrees for about 20 minutes to about 40 minutes.

2. The method of claim 1, wherein forming an SSOI layer on a buried oxide layer on a bulk substrate comprises slicing the SSOI layer from a donor substrate and bonding the SSOI layer to the buried oxide layer.

3. The method of claim 1, wherein annealing a remaining portion of the fins comprises subjecting the SSOI layer to an elevated temperature.

4. The method of claim 3, wherein subjecting the SSOI layer to an elevated temperature comprises pre-baking the SSOI layer at a temperature of about 700 degrees C. to about 900 degrees C. for about 2 minutes to about 30 minutes.

5. The method of claim 3, wherein subjecting the SSOI layer to an elevated temperature comprises pre-baking the SSOI layer at a temperature of about 800 degrees C. for about 2 minutes.

6. The method of claim 1, wherein forming a plurality of fins in the SSOI layer comprises etching the SSOI layer.

7. A method for fabricating a semiconductor device, comprising:

attaching a tensile SSOI layer to a first surface of a substrate;

forming a plurality of fins in the SSOI layer;

forming a gate across and transverse to the plurality of fins;

removing at least a portion of the fins using an etching technique;

subjecting remaining portions of the fins to an elevated temperature to relax a tensile strain of the fins;

merging the remaining portions of the fins on a source side of the gate using an epitaxial growth of at least one of Si and SiGe on the fins to form a merged source region; and merging the remaining portions of the fins on a drain side of the gate using an epitaxial growth of at least one of Si and SiGe on the fins to form a merged drain region.

8. The method of claim 7, wherein attaching an SSOI layer to a first surface of a substrate comprises removing a layer of SSOI from a donor substrate and bonding the layer of SSOI to the first surface of the substrate.

9. The method of claim 7, wherein forming a plurality of fins in the SSOI layer comprises etching the SSOI layer.

10. The method of claim 7, wherein subjecting the fins to an elevated temperature comprises subjecting the fins to a temperature of about 700 degrees C. to about 900 degrees C. for about 2 minutes to about 30 minutes.

11. The method of claim 7, wherein subjecting the fins to an elevated temperature comprises subjecting the fins to a temperature of about 800 degree C. for about 2 minutes.

12. The method of claim 7, further comprising forming source extension regions and drain extension regions under the gate.

13. The method of claim 12, wherein the source extension regions and drain extension regions are formed under the gate by implantation of ions.

14. The method of claim 7 further comprising doping the merged source region and the merged drain region with one or more of phosphorous and boron.

15. The method of claim 7, further comprising forming silicide caps on upper surfaces of the merged source region and the merged drain region.

16. The method of claim 7, wherein merging the remaining portions of the fins on a source side of the gate using an epitaxial growth of at least one of Si and SiGe on the fins to form a merged source region, and merging the remaining portions of the fins on a drain side of the gate using an epitaxial growth of at least one of Si and SiGe on the fins to form a merged drain region, comprises depositing at least one of Si and SiGe on the fins and heating the fins to a temperature of about 500 degrees to about 850 degrees for about 20 minutes to about 40 minutes.

* * * * *